United States Patent
Hibino et al.

(10) Patent No.: US 10,316,146 B2
(45) Date of Patent: Jun. 11, 2019

(54) RESIN COMPOSITION, SOLID IMAGING ELEMENT OBTAINED USING SAME, AND PROCESS FOR PRODUCING SAME

(71) Applicant: TORAY INDUSTRIES, INC., Tokyo (JP)

(72) Inventors: Toshiyasu Hibino, Otsu (JP); Manami Fujii, Otsu (JP); Mitsuhito Suwa, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 25 days.

(21) Appl. No.: 15/546,873

(22) PCT Filed: Jan. 20, 2016

(86) PCT No.: PCT/JP2016/051580
§ 371 (c)(1),
(2) Date: Jul. 27, 2017

(87) PCT Pub. No.: WO2016/121598
PCT Pub. Date: Aug. 4, 2016

(65) Prior Publication Data
US 2018/0016399 A1    Jan. 18, 2018

(30) Foreign Application Priority Data

Jan. 30, 2015 (JP) .................... 2015-017051
Sep. 16, 2015 (JP) .................... 2015-182491

(51) Int. Cl.

| | | |
|---|---|---|
| C08G 77/14 | (2006.01) | |
| C08K 3/36 | (2006.01) | |
| C08K 5/07 | (2006.01) | |
| C08K 5/10 | (2006.01) | |
| C08K 5/17 | (2006.01) | |
| C08G 77/24 | (2006.01) | |
| C08L 83/04 | (2006.01) | |
| G02B 1/111 | (2015.01) | |
| H01L 27/14 | (2006.01) | |
| H04N 5/369 | (2011.01) | |
| C08J 3/09 | (2006.01) | |
| C09D 183/04 | (2006.01) | |
| H01L 31/0203 | (2014.01) | |

(52) U.S. Cl.
CPC .......... *C08G 77/14* (2013.01); *C08G 77/24* (2013.01); *C08J 3/095* (2013.01); *C08K 3/36* (2013.01); *C08K 5/07* (2013.01); *C08K 5/10* (2013.01); *C08K 5/17* (2013.01); *C08L 83/04* (2013.01); *C09D 183/04* (2013.01); *G02B 1/111* (2013.01); *H01L 27/14* (2013.01); *H01L 31/0203* (2013.01); *H04N 5/369* (2013.01); *C08J 2383/04* (2013.01)

(58) Field of Classification Search
CPC .................................. C08G 77/24; C08K 3/36
See application file for complete search history.

(56) References Cited

U.S. PATENT DOCUMENTS

| | | | |
|---|---|---|---|
| 4,513,115 A | 4/1985 | Beers | |
| 4,863,992 A | 9/1989 | Wengrovius et al. | |
| 2006/0105155 A1* | 5/2006 | Ikeyama | G02B 5/0226 428/220 |
| 2008/0167425 A1* | 7/2008 | Tominaga | C08G 77/02 524/837 |
| 2009/0050852 A1 | 2/2009 | Kanamori et al. | |
| 2010/0289939 A1 | 11/2010 | Ogino et al. | |
| 2014/0054738 A1 | 2/2014 | Yamamoto et al. | |

FOREIGN PATENT DOCUMENTS

| | | |
|---|---|---|
| JP | 01113429 A | 5/1989 |
| JP | 0543803 A | 2/1993 |
| JP | 06192576 A | 7/1994 |
| JP | 08122501 A | 5/1996 |
| JP | 2001181570 A | 7/2001 |
| JP | 2003258224 A | 9/2003 |
| JP | 3921952 B2 | 5/2007 |
| JP | 2007270056 A | 10/2007 |
| JP | 2010267770 A | 11/2010 |
| JP | 2012087316 A | 5/2012 |
| JP | 2014040558 A | 3/2014 |
| WO | 2005123838 A1 | 4/2008 |

OTHER PUBLICATIONS

International Search Report and Written Opinion for International Application No. PCT/JP2016/051580, dated Apr. 12, 2016—8 Pages.

* cited by examiner

*Primary Examiner* — Kuo Liang Peng
(74) *Attorney, Agent, or Firm* — RatnerPrestia

(57) ABSTRACT

A resin composition which includes (a) a solvent, (b) silica particles, (c) a polysiloxane, and (d) a secondary or tertiary amine compound, wherein the solvent (a) includes an organic acid. From the resin composition, an even film is easily formed even on bases having protrusions and recesses, such as lens shapes. The resin composition has satisfactory storage stability.

16 Claims, 2 Drawing Sheets

RESIN COMPOSITION, SOLID IMAGING ELEMENT OBTAINED USING SAME, AND PROCESS FOR PRODUCING SAME

CROSS REFERENCE TO RELATED APPLICATIONS

This is the U.S. National Phase application of PCT International Application No. PCT/JP2016/051580, filed Jan. 20, 2016, and claims priority to Japanese Patent Application No. 2015-017051, filed Jan. 30, 2015, and Japanese Patent Application No. 2015-182491, filed Sep. 16, 2015, the disclosures of each of these applications being incorporated herein by reference in their entireties for all purposes.

FIELD OF THE INVENTION

The present invention relates to a resin composition. Further, the present invention relates to a solid imaging element obtained using the same and a process for producing a solid imaging element.

BACKGROUND OF THE INVENTION

Techniques for combining a polysiloxane with silica particles are widely practiced and are widely known. The techniques are made for attaining an antifouling effect, an improvement in hardness, a decrease in refractive index, or the like, and are useful in a wide variety of fields.

Incidentally, in a solid imaging element such as a CCD, it has been proposed to form a light condensing microlens on a photoelectric conversion element and to form an anti-reflection film on a surface of the microlens. An anti-reflection film plays a role of preventing noise such as flare or ghost.

Methods of forming an anti-reflection film can be roughly classified into a coating method and a vapor-phase growth method, and among them, the former method is low in cost. In the case of an anti-reflection film formed by vapor-phase growth method, large-scale equipment is generally required, and further it is difficult to form a film having a large area.

An anti-reflection film formed by coating method is generally obtained by a simple step of applying a liquid (coating-type composition) capable of being formed into an anti-reflection film on a substrate and curing the liquid to form a film.

As an anti-reflection film formed by coating method on a lens, there have been proposed an anti-reflection film formed by using a porous layer containing a large number of spaces in the resin (see, for example, Patent Document 1); an anti-reflection film formed by thermal fusion of a low refractive index resin with a lens surface (see, for example, Patent Document 2); an anti-reflection film containing hollow silica and a binder resin (see, for example, Patent Document 3); an anti-reflection film formed by curing a coating solution containing silica sol and a hydrolyzate of alkoxysilane (see, for example, Patent Document 4), and the like.

PATENT DOCUMENTS

Patent Document 1 JP No. 3921952
Patent Document 2 Japanese Patent Laid-open Publication No. 2003-258224
Patent Document 3 Japanese Patent Laid-open Publication No. 2010-267770
Patent Document 4 Japanese Patent Laid-open Publication No. H08-122501

SUMMARY OF THE INVENTION

However, there has been a problem that it is difficult to form an anti-reflection film having high film thickness uniformity on an uneven base such as a lens shape. For example, in the case of using the coating-type composition as described above, the coating-type composition flows into concave portions between lenses, and almost no film is formed on the top of lens. The gap between lenses does not form a V-shape, but forms a rounded shape with a convex downwardly, so that incident light cannot be taken in the photoelectric light-receiving portion and the sensitivity is not improved. In addition, it is difficult to obtain a uniform film also from the viewpoint that coating defects such as striation occur due to the uneven base.

Since silica particles are contained in the system, there has also been a problem in storage stability such that particles are precipitated during storage of the composition.

It is an object of the present invention to provide a resin composition which easily gives a uniform film even on an uneven base such as a lens shape and which has good storage stability.

The present invention includes providing a resin composition comprising a solvent (a), silica particles (b), a polysiloxane (c) and a secondary or tertiary amine compound (d), wherein the solvent (a) contains an organic acid.

The present invention can provide a resin composition that attains both good coatability and storage stability. Further, the present invention can provide a process for producing a solid imaging element, which is capable of improving production efficiency.

DETAILED DESCRIPTION OF EMBODIMENTS OF THE INVENTION

<Resin Composition>

Figure 1:
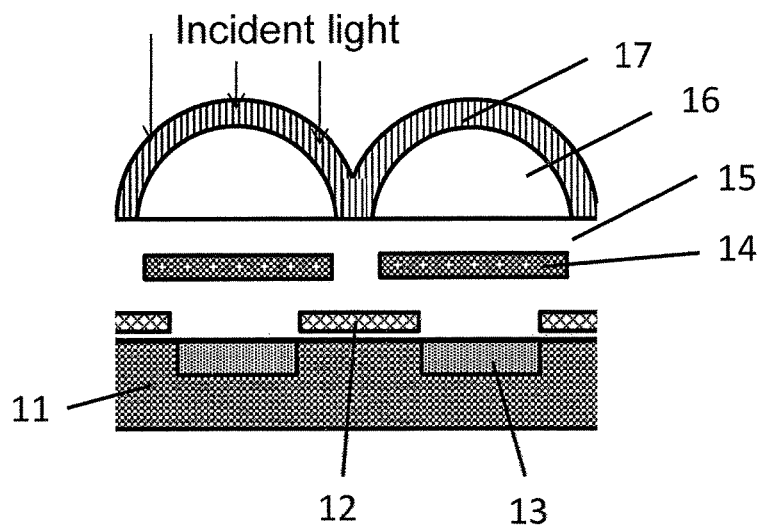
FIG. 1 is a partial cross-sectional diagram showing one embodiment of a solid imaging element according to the present invention.

The present invention includes providing a resin composition including a solvent (a), silica particles (b), a polysiloxane (c) and a secondary or tertiary amine compound (d), in which the solvent (a) contains an organic acid.

In the resin composition of an embodiment of the present invention, the solvent (a) contains an organic acid. Since the solvent contains an organic acid, the composition as a whole indicates acidity. Accordingly, the curing reaction of the polysiloxane due to the action of the secondary or tertiary amine (d) can be suppressed, and the composition can be stabilized.

When the solvent (a) contains an organic acid, it is possible not only to stabilize the composition, but also to achieve satisfactory unevenness followability of the resin composition when the resin composition is applied onto an uneven substrate. The reason for this is presumed as follows. Since the organic acid volatilizes in the step of applying the resin composition, the acidity of the composition is weakened. According to the weakness of the acidity of the composition, the secondary or tertiary amine compound (d) functions as a curing catalyst for the polysiloxane. Accordingly, curing of the polysiloxane progresses gradually from the coating step, and the fluidity of the composition becomes moderately small. As a result, it is considered that a film that follows the uneven shape can be formed without flowing of the resin on the uneven substrate.

(Solvent)

The organic acid contained in the solvent is not particularly limited as long as the organic acid has a pH of 6.8 or less. From the viewpoint of the stable coexistence of the secondary or tertiary amine compound (d), an organic acid having a pH of 4.0 to 6.8 is more preferable.

It should be noted that the pH referred to herein means pH when a solvent of interest is diluted 5-fold in terms of mass ratio with a 50% by mass aqueous ethanol solution. An apparatus is calibrated with a "neutral phosphate pH standard solution (pH 6.86)" and a "phthalate pH standard solution (pH 4.01)", and pH at 25° C. is measured. These standard solutions can be purchased from reagent manufacturers such as Wako Pure Chemical Industries, Ltd. and Tokyo Chemical Industry Co., Ltd.

A pH measuring machine is not particularly specified, but is preferably one capable of displaying two or more decimal places. Specific examples of the pH measuring machine include "LAQUA series (manufactured by HORIBA, Ltd.)", "LAQUAact series (manufactured by HORIBA, Ltd.)", "LAQUAtwin series (manufactured by HORIBA, Ltd.)", and the like.

Specific examples of the organic acid having a pH of 4.0 to 6.8 include phenols, β-diketones, thiols, and the like. A compound having a β-diketone structure represented by general formula (1) is preferred in consideration of safety for human body and odor.

[Chemical Formula 1]

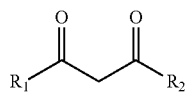

(1)

In general formula (1), $R^1$ and $R^2$ may be the same or different and each represent —$CH_3$, —$C_2H_5$, —$C_3H_7$, —$C_4H_9$, —$OCH_3$, —$OC_2H_5$, —$OC_3H_7$, or —$OC_4H_9$.

The compound having a β-diketone structure is known to form a complex with various metal elements. In addition, the compound having a β-diketone structure has keto-enol tautomerism, both a keto form and an enol form are present, so that keto-enol tautomerism is caused by both acid/base catalysts. Due to these specific properties, it is possible to suppress polycondensation and dispersion deterioration of polysiloxane and silica particles during storage of the composition.

In this specification, a solvent having a β-diketone structure is represented by a keto form, but it is not intended to exclude an enol form.

Specific examples of the solvent having a β-diketone structure include acetylacetone, 3,5-heptanedione, 2,4-hexanedione, 2,4-heptanedione, dimethyl malonate, dibutyl malonate, diethyl malonate, methyl acetoacetate, ethyl acetoacetate, propyl acetoacetate, butyl acetoacetate, and the like, and among them, acetylacetone, methyl acetoacetate, ethyl acetoacetate are preferably used. Two or more of these solvents may be mixed and used.

The solvent having a β-diketone structure is preferably contained in an amount of 10% by weight or more and less than 70% by weight based on the total solvent in the composition. The amount is more preferably 10% by weight or more and less than 50% by weight. When the amount is the lower limit or more, favorable coatability and storage stability are easily maintained regardless of other solvents in the composition. In addition, when it is less than the upper limit, it is possible to select a solvent that can easily dissolve or disperse the respective components in the composition, and problems such as generation of foreign matters are less likely to occur. It should be noted that this shall not apply to cases where the respective components in the composition are dissolved and dispersed in the solvent having a β-diketone structure without problems.

The boiling point of the solvent having a β-diketone structure is preferably 50° C. or more and 200° C. or less. The boiling point is more preferably 100° C. or more, and more preferably 200° C. or less. There are various coating environments, and thus even a composition that can provide a film without coating defects under a certain environment may cause coating defects such as white turbidity and striation under another environment, for example, under exhaust ventilation is intensified. When the boiling point is 100° C. or more, rapid drying at the time of coating is suppressed, and a film free from coating defects such as white turbidity and striation can be formed without depending on the coating environment. In addition, when the boiling point is 200° C. or less, coating defects such as drying unevenness, cissing, and the liquid pool at the edge after coating are unlikely to occur.

The resin composition of the present invention may contain solvents other than the solvent having a β-diketone structure (hereinafter referred to as "other solvents") as the solvent (a). The other solvents are not limited to organic acids. The other solvents may be those which can disperse or dissolve the other components in the composition and which can be mixed with the solvent having a β-diketone structure. In order to prevent coating defects such as white turbidity, coating unevenness and cissing, the other solvents have a boiling point preferably in a range of 80 to 200° C. By adjusting the ratio between the solvent having a β-diketone structure and the other solvents depending on the film thickness of interest, the coating conditions, the coating environment and the like, it is possible to provide the optimal solvent composition depending on the components in the composition, so that more excellent performance can be easily obtained.

Preferred examples of the other solvents include acetol, 3-hydroxy-3-methyl-2-butanone, 4-hydroxy-3-methyl-2-butanone, 5-hydroxy-2-pentanone, 4-hydroxy-4-methyl-2-pentanone (diacetone alcohol), ethyl lactate, butyl lactate, propylene glycol monomethyl ether, propylene glycol monoethyl ether, propylene glycol mono-n-propyl ether, propylene glycol mono-n-butyl ether, diethylene glycol monomethyl ether, diethylene glycol monoethyl ether, dipropylene glycol monomethyl ether, 3-methoxy-1-butanol, 3-methyl-3-methoxy-1-butanol, ethyl acetate, n-propyl acetate, isopropyl acetate, n-butyl acetate, isobutyl acetate, propylene glycol monomethyl ether acetate, 3-methoxy-1-butyl acetate, 3-methyl-3-methoxy-1-butyl acetate, methyl isobutyl ketone, diisopropyl ketone, diisobutyl ketone, diethyl ether, diisopropyl ether, di-n-butyl ether, diphenyl ether, diethylene glycol ethyl methyl ether, diethylene glycol dimethyl ether, cyclopentanone, cyclohexanone, cycloheptanone, and the like. Two or more of them may be contained.

The proportion of the organic acid in the component (a) is preferably 5% by weight or more and less than 60% by weight based on the total solvent. The proportion is more preferably 10% by weight or more and 50% by weight or less. When the proportion is 5% by weight or more based on the total solvent, the acidity is strong and siloxane can be more stabilized.

(Silica Particles)

The resin composition of an embodiment of the present invention contains silica particles (b). By containing the silica particles, it is possible that the air layer is secured in the gaps formed between the particles to lower the refractive index when the resin composition is formed into a film.

As the silica particles (b), commercially available silica particles can be suitably used. Examples of the silica particles that can be used include silica particles such as "OSCAL" series (for example, Product Nos. 101, 105 and 106), "Cataloid SI" series and "THRULYA" series manufactured by JGC Catalysts and Chemicals Ltd.;

"QUARTRON" PL series (IPA dispersion, toluene dispersion, propylene glycol monomethyl ether dispersion, methyl ethyl ketone dispersion, etc., for example, Product Nos. PL-1-IPA and PL-2L-PGME) and "SILICA NANO POWDER" (for example, HSP-2S and HSP-3C) manufactured by Fuso Chemical Industry Co., Ltd.; "SNOWTEX" series (IPA dispersion, ethylene glycol dispersion, methyl ethyl ketone (MEK) dispersion, dimethylacetamide dispersion, MIBK dispersion, propylene glycol monomethyl acetate dispersion, propylene glycol monomethyl ether dispersion, methanol dispersion, ethyl acetate dispersion, butyl acetate dispersion, xylene-n-butanol dispersion, toluene dispersion, etc., for example, Product Nos. PGM-ST, PMA-ST, IPA-ST, IPA-ST-L, IPA-ST-ZL and IPA-ST-UP) manufactured by Nissan Chemical Industries, Ltd.;

"ADMANANO" series (for example, Product Nos. YA010C and YA050C) manufactured by Admatechs;

Spherical silica (SiO2) SG-SO 100 manufactured by KCM Corporation Co., Ltd.;

"REOROSIL" series manufactured by Tokuyama Corporation; and the like.

The silica particles (b) preferably have a particle size of 1 to 100 nm, and are preferably spherical silica particles having a particle size of 1 to 100 nm. The lower limit of the particle size is more preferably 5 nm or more. The upper limit is more preferably less than 60 nm, and further preferably less than 40 nm. The silica particles (b) are preferably particles each having no pores in its structure. When the silica particles (b) have a particle size of the lower limit or more, it is easy to secure the air layer between particles while suppressing gelling of particles during storage. In addition, when the silica particles (b) have a particle size of less than the upper limit, the surface roughness when the resin composition is formed into a film can be suppressed, and a transparent film with little haze can be easily obtained.

The particle size of the silica used in the present invention refers to a particle size calculated from the formula of diameter D (nm)=2720/S with the specific surface area S (m$^2$/g) determined by nitrogen adsorption method (BET method).

The proportion of the silica particles (b) in the total solid content of the composition is preferably 60% by weight or more and less than 100% by weight. The lower limit is more preferably 70% by weight or more. The upper limit is more preferably 99% by weight or less, and further preferably 90% by weight or less. When the proportion of the silica particles (b) in the total solid content is 60% by weight or more, the network between the silica particles is maintained and thixotropy is secured. In addition, polysiloxane is prevented from being filled between silica particles in the formed film, and the refractive index of the film is kept low by keeping the air layer. When the proportion in the total solid content is less than 100% by weight, the composition can contain a binder component, and the film formability is secured.

(Polysiloxane)

The resin composition of an embodiment of the present invention contains a polysiloxane (c). The polysiloxane (c) mainly functions as a binder. Likewise the silica particles (b), inclusion of silicon hardly causes to separate the two layers.

The proportion of the polysiloxane (c) in the total solid content of the composition is preferably 1% by weight or more and less than 40% by weight, and more preferably 1% by weight or more and less than 30% by weight. When the proportion in the total solid content is 1% by weight or more, the polysiloxane (c) sufficiently functions as a binder, and cracks after film formation can be suppressed. When the proportion in the total solid content is less than 40% by weight, the network between silica particles is maintained and thixotropy is secured. In addition, polysiloxane is prevented from being filled between silica particles in the formed film, and the air layer is kept so that the refractive index of the film is kept low.

The polysiloxane (c) is preferably a polysiloxane obtained by hydrolyzing and/or polycondensing an alkoxysilane compound. As the alkoxysilane compound used for the synthesis of the polysiloxane (c), commercially available alkoxysilane compounds can be suitably used.

Examples of the alkoxysilane compound include tetrafunctional silanes such as tetramethoxysilane, tetraethoxysilane, tetraacetoxysilane and tetraphenoxysilane; trifunctional silanes such as methyltrimethoxysilane, methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, vinyltrimethoxysilane, vinyltriethoxysilane, 3-methacryloxypropyltrimethoxysilane, 3-methacryloxypropyltriethoxysilane, 3-acryloxypropyltrimethoxysilane, phenyltrimethoxysilane, phenyltriethoxysilane, p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy)pentyltrimethoxysilane, trifluoromethyltrimethoxysilane, trifluoromethyltriethoxysilane, 3,3,3-trifluoropropyltrimethoxysilane, 3-aminopropyltrimethoxysilane, 3-aminopropyltriethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, [(3-ethyl-3-oxetanyl)methoxy]propyltrimethoxysilane, [(3-ethyl-3-oxetanyl)methoxy]propyltriethoxysilane, 3-mercaptopropyltrimethoxysilane, 3-trimethoxysilylpropylsuccinic anhydride, 1-naphthyltrimethoxysilane, 1-naphthyltriethoxysilane, 1-naphthyltri-n-propoxysilane, 2-naphthyltrimethoxysilane, 1-anthracenyltrimethoxysilane, 9-anthracenyltrimethoxysilane, 9-phenanthrenyltrimethoxysilane, 9-fluorenyltrimethoxysilane, 2-fluorenyltrimethoxysilane, 1-pyrenyltrimethoxysilane, 2-indenyltrimethoxysilane and 5-acenaphthenyltrimethoxysilane; difunctional silanes such as dimethyldimethoxysilane, dimethyldiethoxysilane, dimethyldiacetoxysilane, di-n-butyldimethoxysilane, diphenyldimethoxysilane, (3-glycidoxypropyl)methyldimethoxysilane, (3-glycidoxypropyl)methyldiethoxysilane, di(1-naphthyl)dimethoxysilane and di(1-naphthyl)diethoxysilane; and monofunctional silanes such as trimethylmethoxysilane, tri-n-butylethoxysilane, (3-glycidoxypropyl)dimethylmethoxysilane and (3-glycidoxypropyl)dimethylethoxysilane. Two or more of these organosilanes may be used.

From the viewpoint of controlling the polymerization reaction, it is preferable to use an alkoxysilane compound having three or two alkoxy groups in the molecule.

When an alkoxysilane compound having three alkoxy groups in the molecule is subjected to polycondensation, the resulting polysiloxane has any of partial structures represented by the following general formulas (2) to (4).

[Chemical Formula 2]

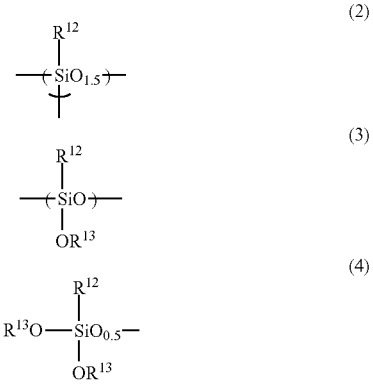

$R^{12}$ in the general formulas (2) to (4) is an organic group, and a plurality of $R^{12}$s may be independently the same or different from one another. $R^{13}$ is a hydrogen atom or an organic group, and a plurality of $R^{13}$s may be independently the same or different from one another.

When an alkoxysilane compound having two alkoxy groups in the molecule is subjected to polycondensation, the resulting polysiloxane has any of partial structures represented by the following general formulas (5) and (6).

[Chemical Formula 3]

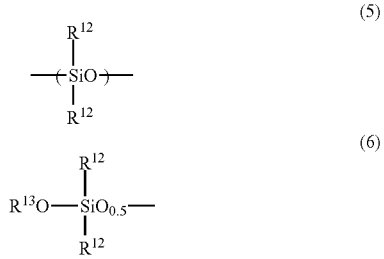

$R^{12}$ in the general formulas (5) and (6) is an organic group, and a plurality of $R^{12}$s may be independently the same or different from one another. $R^{13}$ is a hydrogen atom or an organic group, and a plurality of $R^{13}$s may be independently the same or different from each other.

An example of the alkoxysilane used for the synthesis of the polysiloxane (c) preferably includes a compound represented by the following general formula (7).

[Chemical Formula 4]

$R^3$ is a fluorinated alkyl group having 1 to 5 carbon atoms, and $R^4$, $R^5$ and $R^6$ each independently represent hydrogen or an alkyl group having 1 to 4 carbon atoms.

Since the compound represented by the general formula (7) contains a fluorine atom, the refractive index of the polysiloxane can be lowered.

Specific examples of the alkoxysilane compound represented by the general formula (7) may include trifluoropropyltrimethoxysilane, trifluoropropyltriethoxysilane, perfluoropentyltriethoxysilane, perfluoropentyltrimethoxysilane, and the like.

The proportion of the compound represented by the general formula (7) in the alkoxysilane used for the synthesis of the polysiloxane (c) is preferably 5 mol % or more and less than 70 mol %. When the proportion is set to 5 mol % or more, the effect of fluorine group introduction can be obtained. When the proportion is set to less than 70 mol %, inhibition of hydrolysis and/or polycondensation by fluorine can be suppressed, and a hydrolyzed and/or polycondensed polysiloxane can be obtained.

The alkoxysilane used for the synthesis of the polysiloxane (c) further preferably contains a compound represented by the following general formula (8).

[Chemical Formula 5]

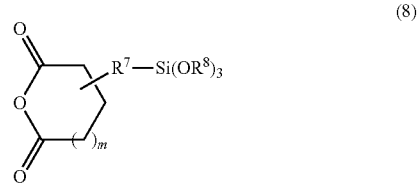

m represents an integer of 0 to 2, $R^7$ represents an alkylene group having 1 to 4 carbon atoms, and each $R^8$ independently represents hydrogen or an alkyl group having 1 to 4 carbon atoms.

By containing the compound represented by the general formula (8), the polymerization is promoted and even if hydrolysis and/or polycondensation would be inhibited by fluorine of the compound represented by the general formula (7), the compound represented by the general formula (8) can accelerate the hydrolysis and/or polycondensation.

Specific examples of the compound represented by the general formula (8) include 3-trimethoxysilylpropylsuccinic anhydride, 3-triethoxysilylpropylsuccinic anhydride, 3-trimethoxysilylethylsuccinic anhydride and 3-trimethoxysilylbutylsuccinic anhydride.

The proportion of the compound represented by the general formula (8) in the alkoxysilane used for the synthesis of the polysiloxane (c) is preferably 1 mol % or more and 20 mol % or less. When the proportion is 1 mol % or more, the effect of introduction can be obtained. When the proportion is 20 mol % or less, coloring due to heating after the composition is formed into a film can be suppressed.

The polysiloxane (c) preferably has one or more of the partial structures represented by the general formulas (2) to (6).

Here, it is preferred that each $R^{12}$ is independently an alkyl group, an alkyl group substituted with a fluorine atom, an alkyl group substituted with a succinic anhydride group, an alkyl group substituted with an epoxy group-containing group, or an aryl group. Specific examples include a methyl group, an ethyl group, a propyl group, a trifluoropropyl group, a 2-(3,4-epoxycyclohexyl)ethyl group, a group derived from the general formula (8), a phenyl group, and a naphthyl group.

Each $R^{13}$ is preferably independently a hydrogen atom or an alkyl group, and more preferably a hydrogen atom, a methyl group or an ethyl group.

(Secondary or Tertiary Amine Compound)

The resin composition of an embodiment of the present invention contains a secondary or tertiary amine compound (d). The secondary or tertiary amine compound (d) is considered to have the following properties other than the property as a curing catalyst for the polysiloxane as described above.

The secondary or tertiary amine compound (d) forms a hydrogen bond with silica particles or polysiloxane contained in the resin composition, or with a microlens substrate. It is considered that the dispersion state of the particles is stabilized by the hydrogen bond between the secondary or tertiary amine compound and the silica particles, and the stability of the resin composition is further improved. It is considered that the adhesion property of the resin composition is further improved by the hydrogen bond between the secondary or tertiary amine compound and the microlens.

When the adhesion property to the microlens is improved, the flow of the resin composition on the microlens substrate can be suppressed. As a result, when the resin composition of the present invention is applied by spin coating onto an uneven substrate such as a microlens array, the effect of suppressing the film at the convex portion from flowing into the concave portion is further increased, and it is easier to obtain a coating film in a shape that follows the base such as an uneven substrate.

Examples of the secondary or tertiary amine compound (d) include:
secondary amines such as
dimethylamine, diethylamine, dipropylamine, diisopropylamine, dibutylamine, diisobutylamine, di-sec-butylamine, di-tert-butylamine, dipentylamine, diisopentylamine, dihexylamine, dicyclohexylamine, dioctylamine, dibenzylamine, diphenylamine, piperidine, 3,5-dimethylpiperidine, 2-ethylpiperidine, 4-isopropylpiperidine, 2-methylpiperidine, 3-methylpiperidine, 4-methylpiperidine, 2,5-diphenylpyrrolidine, 2,6-dimethylpiperidine, 2,2,6,6-tetramethylpiperidine, N-isopropylaniline and N-ethylaniline;
tertiary amines such as
trimethylamine, triethylamine, tripropylamine, triisopropylamine, tributylamine, triisobutylamine, tri-sec-butylamine, tripentylamine, triisopentylamine, trihexylamine, tricyclohexylamine, trioctylamine, tribenzylamine, triphenylamine, diisopropylethylamine, 1-methylpiperidine, 1-methyl-2,2,6,6-tetramethylpiperidine; and the like.

The secondary or tertiary amine compound (d) is not particularly limited, but is preferably a compound represented by the following general formula (9).

[Chemical Formula 6]

(9)

In the general formula (9), each of $R^9$ and $R^{10}$ may be the same or different, and is an aliphatic hydrocarbon group having 2 to 12 carbon atoms. $R^{11}$ is an aliphatic hydrocarbon group having 2 to 12 carbon atoms or a hydrogen atom.

Each of $R^9$ and $R^{10}$ is more preferably an aliphatic hydrocarbon group having 2 to 8 carbon atoms, and further preferably an aliphatic hydrocarbon group having 2 to 6 carbon atoms. $R^9$ and $R^{10}$ may be the same and have a cyclic structure, and the number of carbon atoms is preferably 5 to 10. $R^{11}$ is more preferably an aliphatic hydrocarbon group having 2 to 8 carbon atoms or a hydrogen atom, and further preferably an aliphatic hydrocarbon group having 2 to 6 carbon atoms or a hydrogen atom. When the molecular weight of the secondary or tertiary amine compound decreases, the number of moles of the secondary or tertiary amine compound contained in the resin composition increases even if the weight of the secondary or tertiary amine compound contained in the resin composition is the same, so that the base followability is considered to be further improved.

Examples of the compound represented by the general formula (9) include:
secondary amines such as
dimethylamine, diethylamine, dipropylamine, diisopropylamine, dibutylamine, diisobutylamine, di-sec-butylamine, dipentylamine, diisopentylamine, dihexylamine, dicyclohexylamine, dioctylamine, piperidine, 3,5-dimethylpiperidine, 2-ethylpiperidine, 4-isopropylpiperidine, 2-methylpiperidine, 3-methylpiperidine, 4-methylpiperidine, 2,6-dimethylpiperidine and 2,2,6,6-tetramethylpiperidine;
tertiary amines such as
trimethylamine, triethylamine, tripropylamine, triisopropylamine, tributylamine, triisobutylamine, tri-sec-butylamine, tripentylamine, triisopentylamine, trihexylamine, tricyclohexylamine, trioctylamine, 1-methylpiperidine, 1-ethylpiperidine, 1-methyl-2,2,6,6-tetramethylpiperidine, diisopropylethylamine and di-tert-butylamine;
and the like.

The content of the secondary or tertiary amine compound (d) in the resin composition of the present invention is not particularly limited, but is preferably 1 to 10% by weight based on the total amount of the silica particles (b) and the polysiloxane (c).

(Other Components)

The resin composition of the present invention may contain additives, if necessary. For example, a surfactant may be contained for improving coatability, or a thermal crosslinking agent may be contained for suppressing cracks after film formation. By combining a polyfunctional compound with silica particles, a network is formed and a space is created, so that it is also possible to lower the refractive index. The content of the additives needs to be adjusted according to the purpose.

<Solid Imaging Element>

The present invention includes providing a solid imaging element including a photoelectric conversion portion, a lens provided above a light-receiving surface of the photoelectric conversion portion, and an anti-reflection film provided on the lens, in which the solid imaging element includes a cured film obtained from the resin composition described above.

Since the cured film obtained from the resin composition of the present invention is obtained by coating on the lens with the resin composition in a uniform film thickness without unevenness or cissing, the solid imaging element of the present invention can improve the sensitivity while improving the image quality of a captured image.

In a solid imaging element in which an $SiO_2$ film is formed as an anti-reflection film in a vapor-phase growth production method, voids are generated between the lens and the anti-reflection film due to degassing from the lower part of the lens, so that peeling may occur in the lens-anti-reflection film interface, but in the solid imaging element of the present invention, the anti-reflection film on the lens has good degassing property, and voids are not generated even if there is degassing from the lower part of the lens.

FIG. 1 is a partial cross-sectional diagram showing one embodiment of a solid imaging element to which the present invention can be applied. Electrodes 12 and photoelectric conversion portions 13 are provided on a semiconductor substrate 11. Color filters 14 and a planarized film 15 are provided thereon. The side on which these components are provided is the light-receiving surface of the photoelectric conversion portion, and lenses 16 are provided on the planarized film 15 and an anti-reflection film 17 is provided on the upper surfaces of the lenses. The configuration between the photoelectric conversion portion 13 and the lens 16 is not limited to the above configuration. Many structures such as a waveguide type and a backside illumination type have been developed as the configuration of the solid imaging element, but the effect achieved by the present invention does not change unless the positional relationship between the photoelectric conversion portion 13 and the lens 16 is not changed.

(Semiconductor Substrate)

A material used for the semiconductor substrate 11 is not particularly limited, and known materials can be used. Examples of the material include a silicon wafer, a silicon carbide wafer, and the like.

(Electrode)

A material used for each of the electrodes 12 is not particularly limited, and known materials can be used. Examples of the electrode 12 include transparent electrodes made of polysilicon, ITO, and the like. Since the electrode 12 is responsible for the transfer of signal charge flux, it is formed so as to be adjacent to the photoelectric conversion portion 13 described later.

(Photoelectric Conversion Portion)

Each of the photoelectric conversion portions 13 converts light received through the lens from the light-receiving surface side into an electric signal. In the present invention, the photoelectric conversion portion 13 is not particularly limited, and known configurations can be used.

(Color Filter)

The color filters 14 each are usually composed of patterns of red pixels, green pixels, and blue pixels, and the light of each color is detected by the photoelectric conversion portions 13 provided below the color filters 14. The color filter 14 may further include white pixels. A material used for the color filter 14 is not particularly limited, and known materials can be used.

(Planarized Film)

The planarized film 15 is formed to uniformize the heights of the components arranged inside the element. Thereafter, the planarized film 15 can suppress formation of cracks and the like when the lenses 16 and the like are further formed on the upper portion of the planarized film 15. In the present invention, the planarized film 15 is not particularly limited, and known planarized films can be used. For example, the planarized film 15 is formed by coating and drying various coating-type planarizing materials, or by film formation with trench method or damascene method, followed by surface polishing with CMP.

(Lens)

The lens is formed in the upper portion of the photoelectric conversion portion for improving light condensing efficiency. Known techniques can be used for forming each of the lenses 16. Examples of the technique include photofithography method, etching back method, imprinting method, and the like. The presence or absence and distance of the gap between lenses are irrelevant.

(Anti-Reflection Film)

The anti-reflection film 17 is formed for the purpose of improving the sensitivity by taking in incident light entering into the concave portion of the lenses 16. In the present invention, the cured film obtained from the above-mentioned resin composition is used as the anti-reflection film 17.

The anti-reflection film 17 preferably satisfies $0 \le (d_{45} - d_{TOP})/d_{TOP} \le 0.20$ when the thickness of the cured film in the lens top is defined as $d_{TOP}$, and when the thicknesses of the cured film at the points where in the arbitrary cross section that passes through the lens top and that is orthogonal to the lens bottom surface, a line drawn perpendicularly to the lens bottom surface from the lens top intersects with the lens bottom surface and a line extending at 45° in a left direction and a line extending at 45° in a right direction from the intersecting point of the lens bottom surface intersect with the lens are defined as $d_{45L}$ and $d_{45R}$, respectively, and the average value of $d_{45L}$ and $d_{45R}$ is defined as $d_{45}$.

Figure 2:
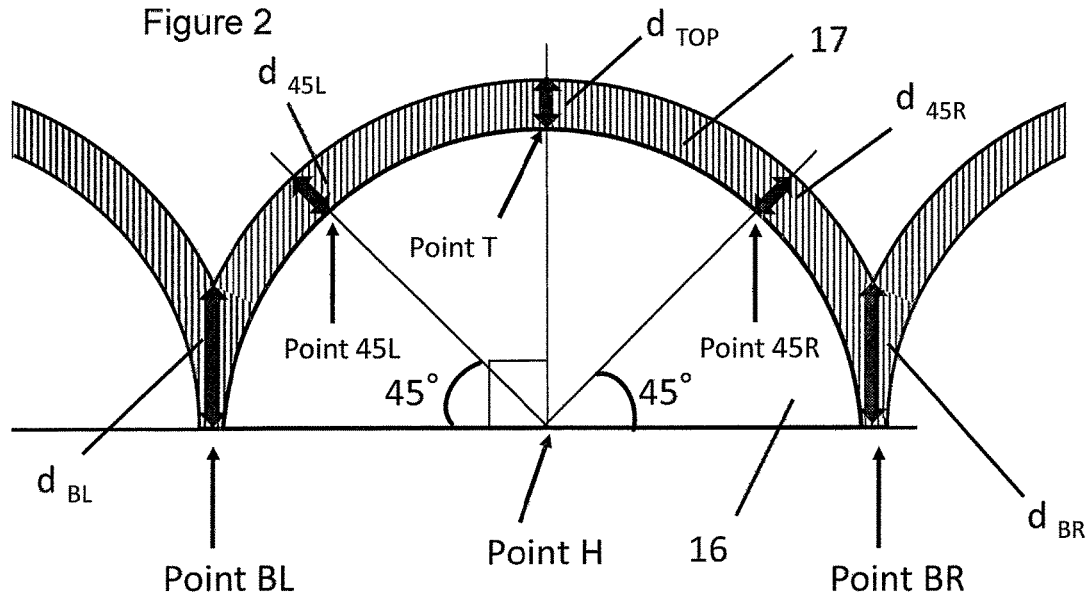
FIG. 2 is a schematic diagram of a cross section that passes through a lens top and is orthogonal to a lens bottom surface.

FIG. 2 shows a schematic diagram of a cross section that passes through the lens top and that is orthogonal to the lens bottom surface. $d_{TOP}$, $d_{45L}$ and $d_{45R}$ are the thickness in the normal direction of the curve at the point T, point 45L, and point 45R, respectively. It can be confirmed that the difference between $d_{TOP}$ and $d_{45}$ is 20% or less of $d_{TOP}$, that is, the film thickness is uniform along the shape of the base by satisfying $0 \le ((d_{45} - d_{TOP})/d_{TOP}) \le 0.20$. At this time, light incident at 45 degrees can also be taken in the photoelectric conversion portion, so that the sensitivity is improved.

Furthermore, the film thickness ($d_{BOTTOM}$) of the gap between lenses, which is the thickness from the lens bottom surface to the surface of the cured film between the adjacent lenses, is preferably less than 3.0 times the film thickness of the lens top ($d_{BOTTOM}/d_{TOP} < 3.0$). By thinning the thickness $d_{BOTTOM}$, the light condensing function of light incident near the gap between lenses is improved, and the sensitivity is further improved. The thickness ($d_{BOTTOM}$) of the gap between lenses is the average value of thicknesses $d_{BL}$ and $d_{BR}$ of points BL and BR.

As in the conventional technique, when a film does not follow the base shape, the anti-reflection film on the lens top portion disappears or becomes extremely thin, so that the thickness becomes large toward the concave portion and $((d_{45} - d_{TOP})/d_{TOP})$ exceeds 0.20. At this time, the shape of the anti-reflection film between the lenses becomes a convex downwardly. It is possible to increase $d_{TOP}$ by making the coating thickness of the anti-reflection film large; however, $d_{45}$ also increases in proportion to the coating thickness of the anti-reflection film, and according to the conventional technique, $((d_{45}-d_{TOP})/d_{TOP})$ is not below 0.20.

In order to improve the sensitivity of the solid imaging element, $0 \leq ((d_{45}-d_{TOP})/d_{TOP}) \leq 0.10$ is more preferable, and $0 \leq ((d_{45}-d_{TOP})/d_{TOP}) \leq 0.05$ is further more preferable.

In the solid imaging element of the present invention, the cured film has a thickness of preferably 50 to 200 nm. When the thickness falls within this range, improvement in the sensitivity of the solid imaging element can be expected.

In the solid imaging element of the present invention, the cured film has a refractive index of preferably 1.2 or more and 1.4 or less at a wavelength of 550 nm. When the refractive index falls within this range, improvement in the sensitivity of the solid imaging element can be expected.

In the process for producing a solid imaging element according to the present invention, the difference of refractive index between the lens and the cured film is preferably 0.2 to 0.8 at a wavelength of 550 nm. The larger the difference of the refractive index is, the more the light condensing efficiency to the photoelectric conversion portion is improved, so that the sensitivity of the solid imaging element is improved.

<Process for Producing Solid Imaging Element>

The process for producing a solid imaging element according to the present invention is a process for producing the above-described solid imaging element, and the process includes the step of applying the above-described resin composition onto the lens and the step of heating the resin composition.

The resin composition of the present invention can be applied onto the lens with uniform thickness without unevenness or cissing, and it is possible to form a lens-shaped anti-reflection film by coating and heating the resin composition. Since the anti-reflection film can be formed on the lens by a simpler method such as coating and heating, it is possible to improve the production efficiency of the solid imaging element.

Examples of the coating method may include, but are not particularly limited to, known methods such as a spin coating method, a spray coating method, a slit coating method, and a dip coating method; and a spin coating method is preferable. A cured film with favorable base followability can be easily obtained by diverting the apparatus used for forming other members (for example, the color filter 14). The coating conditions are not particularly limited, but an increase in the number of revolutions at the time of spin coating as necessary can reduce the amount of the composition pooled in the concave portion of the uneven substrate, and finally can make the difference of thickness between the concave portion and the convex portion small.

In the step of heating and curing the film after coating, a known overheating method such as a hot plate or an oven is used. At this time, it is preferable to perform the first stage bake at 80 to 130° C. and the second stage bake at 180 to 300° C., so that it is possible to suppress the formation of cracks and voids. When the solvent in the film is substantially volatilized during spin coating, bumping of the solvent does not occur in the subsequent baking, and cissing, white turbidity and the like can be suppressed.

When preliminary calculation is performed regarding how much the production efficiency is improved as compared with the conventional technique by producing the solid imaging element according to the present invention, it is as follows.

First, according to the conventional technique, a plasma CVD apparatus is required as an apparatus for forming an anti-reflection film, and several hundred million yen is required for introducing the facility. In addition, it takes several hours per wafer to form a film.

On the other hand, according to the present invention, a spin coater or a hot plate is sufficient as the apparatus for forming an anti-reflection film, so that a large expense is not required for introducing the facility. In addition, the time required for forming a film is considerably shortened to several minutes per wafer.

EXAMPLES

Hereinafter, the present invention will be described more specifically with reference to examples, but the present invention is not limited to these examples. Among the compounds used in synthesis examples and examples, those represented by abbreviations will be shown below.

Alkoxysilane Compounds
MTM: methyltrimethoxysilane
FTM: trifluoropropyl trimethoxysilane
TMSu: 3-trimethoxysilylpropylsuccinic anhydride
DimDM: dimethyldimethoxysilane
EpoTM: 2-(3,4-epoxycyclohexyl)ethyltrimethoxysilane
NapTM: 1-naphthyl trimethoxysilane
GlyTM: 3-glycidoxypropyl trimethoxysilane
Solvent
PGMEA: propylene glycol monomethyl ether acetate
PGME: propylene glycol monomethyl ether
PTB: propylene glycol-t-butyl ether
DAA: diacetone alcohol
IPA: isopropyl alcohol
Solvent (Organic Acid)
AcAc: acetylacetone
EAA: ethyl acetoacetate
DMM: dimethyl malonate
MAA: methyl acetoacetate
PAA: propyl acetoacetate
DEM: diethyl malonate
n-BAA: butyl acetoacetate The solid content concentration of a polysiloxane solution was determined by the following method. A polysiloxane solution in an amount of 1.5 g was weighed in an aluminum cup, and was heated at 250° C. for 30 minutes using a hot plate to evaporate the liquid component. The solid content remaining in the aluminum cup after heating was weighed, and the solid content concentration of the polysiloxane solution was determined.

Synthesis Example 1: Synthesis of Polysiloxane Solution (i)

Into a 500 mL three-necked flask were charged 29.96 g (0.22 mol) of MTM, 60.02 g (0.27 mol) of FTM, 14.43 g (0.06 mol) of TMSu and 110.05 g of PGMEA, and 30.69 g of water was added to the mixture over 30 minutes while stirring at room temperature. Thereafter, the flask was immersed in an oil bath at 70° C. and the mixture was stirred for one hour, and then the oil bath was heated to 120° C. over 30 minutes. The internal temperature of the solution reached 100° C. one hour after the beginning of the temperature rising, and the mixture was stirred under heat for additional 3 hours (internal temperature was 100 to 110° C.) Methanol and water as by-products were distilled out in a total amount of 85 g during the reaction. The solution of polysiloxane in PGMEA remaining in the flask was obtained as a polysiloxane solution (i). The solid content of this solution was 38.90%.

Polysiloxane solution (i): MTM/FTM/TMSu=40/50/10 (mol %)

Synthesis Example 2: Synthesis of Polysiloxane Solution (ii)

In a 500 mL three-necked flask were charged 12.02 g (0.1 mol) of DimDM, 27.28 g (0.12 mol) of FTM, 6.56 g (0.02 mol) of TMSu and 47.41 g of PGMEA, and 13.95 g of water was added to the mixture over 30 minutes while stirring at room temperature. Thereafter, the flask was immersed in an oil bath at 70° C. and the mixture was stirred for one hour, and then the oil bath was heated to 120° C. over 30 minutes. The internal temperature of the solution reached 100° C. one hour after the beginning of the temperature rising, and the mixture was stirred under heat for additional 3 hours (internal temperature was 100 to 110° C.). Methanol and water as by-products were distilled out in a total amount of 25 g during the reaction. The solution of polysiloxane in PGMEA remaining in the flask was obtained as a polysiloxane solution (ii). The solid content of this solution was 33.91%.
Polysiloxane solution (ii): DimDM/FTM/TMSu=40/50/10 (mol %)

Synthesis Example 3: Synthesis of Polysiloxane Solution (iii)

Into a 500 mL three-necked flask were charged 40.23 g (0.03 mol) of MTM, 32.24 g (0.15 mol) of FTM, 12.13 g (0.05 mol) of EpoTM and 47.41 g of PTB, and 27.89 g of 1.5 wt % aqueous phosphate was added to the mixture over 30 minutes while stirring at room temperature. Thereafter, the flask was immersed in an oil bath at 70° C. and the mixture was stirred for one hour, and then the oil bath was heated to 120° C. over 30 minutes. The internal temperature of the solution reached 100° C. one hour after the beginning of the temperature rising, and the mixture was stirred under heat for additional 3 hours (internal temperature was 100 to 110° C.). Methanol and water as by-products were distilled out in a total amount of 62 g during the reaction. The solution of polysiloxane in PGMEA remaining in the flask was obtained as a polysiloxane solution (iii). The solid content of this solution was 39.72%.
Polysiloxane solution (iii): MTM/FTM/EpoTM=30/60/10 (mol %)

Synthesis Example 4: Synthesis of Polysiloxane Solution (iv)

Into a 500 mL three-necked flask were charged 40.23 g (0.03 mol) of MTM, 61.43 g (0.25 mol) of NapTM, 5.84 g (0.02 mol) of GlyTM and 94.33 g of DAA, and 28.08 g of 3.2 wt % aqueous phosphate was added to the mixture over 30 minutes while stirring at room temperature. Thereafter, the flask was immersed in an oil bath at 70° C. and the mixture was stirred for one hour, and then the oil bath was heated to 120° C. over 30 minutes. The internal temperature of the solution reached 100° C. one hour after the beginning of the temperature rising, and the mixture was stirred under heat for additional 2 hours (internal temperature was 100 to 110° C.). Methanol and water as by-products were distilled out in a total amount of 63 g during the reaction. The solution of polysiloxane in PGMEA remaining in the flask was obtained as a polysiloxane solution (iv). The solid content of this solution was 48.84%.

Polysiloxane solution (iv): MTM/NapTM/GlyTM=45/50/5 (mol %)

Preparation Example of Substrate: Preparation of Microlens Array

Figure 3:
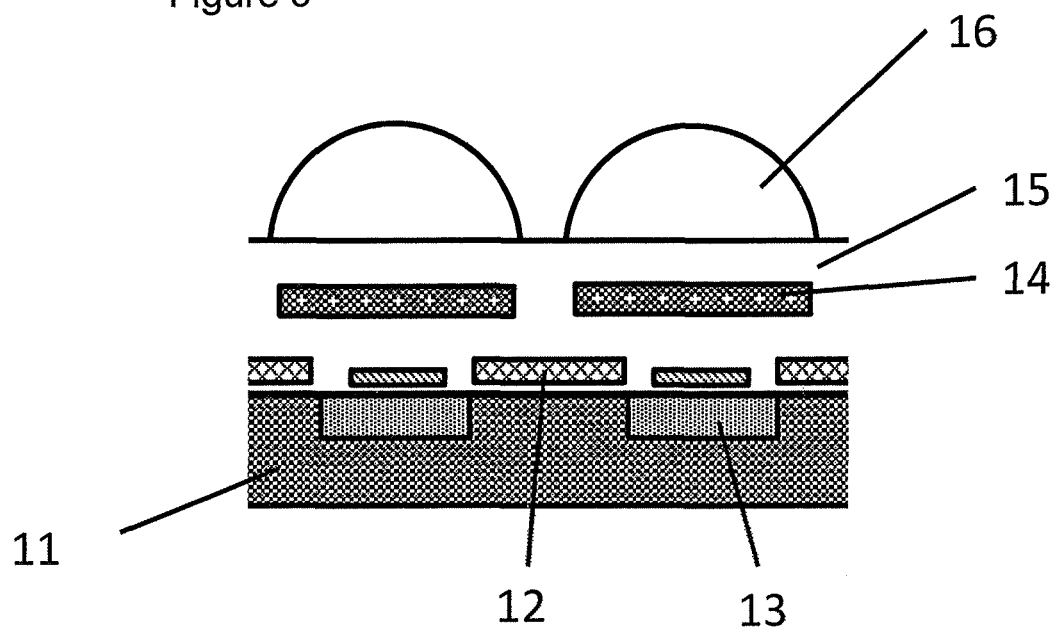
FIG. 3 is a cross-sectional diagram showing a microlens array before a cured film is formed on a lens.

As shown in FIG. 3, a substrate was obtained which included electrodes 12, photoelectric conversion portions 13, color filters 14, a planarized film 15, and microlenses 16 with a pitch of 3 µm formed on a semiconductor substrate 11 (hereinafter referred to as a microlens array).

Example 1

PGMEA 2.377 g/PGME 1.039 g/EAA 0.960 g (Solvent ratio: PGMEA/PGME/EAA=50/30/20) as a component (a), 0.536 g of "QUARTRON" PL-2L-PGME (manufactured by FUSO CHEMICAL CO., LTD., a particle size of 10 to 15 nm) as a component (b), and 0.037 g of a polysiloxane solution (i) as a component (c) were mixed, shaken and stirred, and then filtered through a filter having a diameter of 0.2 µm to obtain a composition. The prepared composition was spin-coated at 700 rpm for 60 seconds on the microlens array and a silicon wafer by a spin coater (1H-360S manufactured by Mikasa Co., Ltd.), and then prebaked at 120° C. for 3 minutes by a hot plate (SCW-636 Dainippon Screen MFG. Co., Ltd.), and then further cured at 220° C. for 5 minutes by a hot plate to prepare a cured film.

The evaluation results are shown in Table 3. A microlens array was used for the evaluation of item (II), and a silicon wafer was used as a substrate for the evaluations of items (I), and (III) to (V).

(I) n Value (Refractive Index)

An n value in the range of 300 to 800 nm was measured using a reflectance spectrophotometer FE-3000 (manufactured by Otsuka Electronics Co., Ltd.).

(II) Film Cross-Sectional Shape

The microlens array was scratched and cleaved, and a cross section of the film was exposed. The cross section of the film was observed with a field emission scanning electron microscope (FE-SEM) S-4800 (manufactured by Hitachi High-Technologies Corporation) at an acceleration voltage of 3 kV. $d_{TOP}$, $d_{45L}$, $d_{45R}$, $d_{BL}$ and $d_{BR}$ were measured respectively at a magnification of about 2 to 50,000 times, and $d_{45}$, $(d_{45}-d_{TOP}/d_{TOP})$, and $d_{BOTTOM}/d_{TOP}$ were determined by calculation. When the value of each of $d_{45}$ and $(d_{45}-d_{TOP}/d_{TOP})$ was 0.05 or less, it was determined that the film thickness uniformity was excellent (A); when the value was more than 0.05 and 0.20 or less, it was determined that the film thickness uniformity was good (B); and when the value was more than 0.20, it was determined that the film thickness uniformity was poor (C). Further, when the value of $d_{BOTTOM}/d_{TOP}$ was less than 3, it was determined that the base followability was good (o); and when the value was 3 or more, it was determined that the base followability was poor (x).

(III) Coatability

The film after curing was visually confirmed. When there was no unevenness or coating abnormality, it was determined that the coatability was good (0), and when there was abnormality, it was determined that the coatability was poor (X).

(IV) Surface Roughness (Ra)

An Ra value was measured with an atomic force microscope (AFM) Nanoscope (manufactured by Bruker AXS Co., Ltd.).

(V) Storage Stability

A resin composition was stored in a constant temperature bath at 40° C., and the storage stability for 7 days was visually confirmed. When there was no change in the resin composition and storage bottle, it was determined that the storage stability was good (O), and when there was change, it was determined that the storage stability was poor (X).

Examples 2 to 27

Each of the components was mixed in the ratios shown in Tables 1 and 2, and compositions were obtained in the same manner as in Example 1. In addition to "QUARTRON" PL-2L-PGME, "QUARTRON" PL-2L-IPA (particle size 10 to 15 nm) (manufactured by Fuso Chemical Co., Ltd.), "Snowtex" IPA-ST (particle size 10 to 20 nm), PGM-ST (particle size 10 to 20 nm) (manufactured by Nissan Chemical Industries, Ltd.), or "ADMANANO" YA010C-SV1 (particle size 10 nm) (manufactured by Admatechs Co., Ltd.) was used as a component (b). In addition to the polysiloxane solutions (i) to (iv), ethyl silicate 48 (manufactured by Colcoat Co., Ltd., an inorganic silicon compound which has an ethoxy group and which is composed of a siloxane bond) was used as a component (c).

Each of the obtained compositions was formed into a film in the same manner as in Example 1, and the above items (I) to (V) were evaluated. The evaluation results are shown in Table 3.

Comparative Example 1

As a component (a), 2.268 g of ethanol/0.129 g of IPA/3.056 g of ethylene glycol monobutyl ether (solvent ratio: ethanol/IPA/ethylene glycol monobutyl ether=39/8.5/52.5), as a component (b), 0.522 g of "Snowtex" IPA-ST, and as a component (c), 0.025 g of ethyl silicate 48 were mixed, shaken and stirred, and then filtered through a filter having a diameter of 0.2 μm to obtain a composition. The obtained composition was formed into a film in the same manner as in Example 1, and the above items (I) to (V) were evaluated. The evaluation results are shown in Table 6. Ethanol, IPA and ethylene glycol monobutyl ether do not correspond to an organic acid.

Comparative Examples 2 to 6

Each of the components was mixed in the ratios shown in Table 3, and compositions were obtained in the same manner as in Example 1. Each of the obtained compositions was formed into a film in the same manner as in Example 1, and the above items (I) to (V) were evaluated. The evaluation results are shown in Table 6.

It is understood from Examples 1 to 27 in the tables that the present invention provides a resin composition having good coatability and storage stability.

In particular, from the comparison between Example 1 and Comparative Example 6, it is understood that application of a secondary or tertiary amine as a component (d) greatly improves the base followability.

Further, from the comparison between Example 2 and Comparative Example 5, it is understood that application of a β-diketone solvent which is an organic acid as a component (a) greatly improves the coatability and storage stability.

Further, from the comparison between Example 1 and Example 4 or 5, it is understood that a composition containing an alkoxysilane compound represented by the general formula (2) and an alkoxysilane compound represented by the general formula (3) as components (c) has a lower refractive index, and that the film on the lens has more uniform thickness.

$d_{BOTTOM}/d_{TOP}$ of each of Examples 18 to 21, 23 to 24 and 26 to 27 is smaller than that of each of Examples 22 and 25, and therefore it is understood that a secondary or tertiary amine compound containing an aliphatic hydrocarbon group having 2 to 6 carbon atoms is more preferable.

In Comparative Examples 1, 2 and 5, when the resin composition was applied onto a microlens array and a silicon wafer substrate, brush marks appeared, a flat and uniform film could not be obtained, and the followability for base shape was poor. After one or two days storage, particles were deposited at the opening of the bottle. In Comparative Example 3, since the composition did not contain the component (c), a uniform film could not be obtained. In Comparative Example 4, since the composition did not contain the component (b), the refractive index was high and the followability for base shape was deteriorated. In Comparative Example 6, since the composition did not contain the component (d), the followability for base shape was poor.

TABLE 1

| No. | (a) | (b) | (c) | (d) |
|---|---|---|---|---|
| Example 1 | PGMEA/PGME/EAA | "QUARTRON" PL-2L-PGME | Polysiloxane solution (i) | Dicyclohexylamine |
| | 50/30/20 (% by weight) | 90% by weight | 10% by weight | 3% by weight |
| Example 2 | IPA/Ethanol/EAA | "SNOWTEX" IPA-ST | Ethyl Silicate 48 | Dicyclohexylamine |
| | 39/8.5/52.5 (% by weight) | 87% by weight | 13% by weight | 3% by weight |
| Example 3 | PGMEA/PGME/EAA | "QUARTRON" PL-2L-PGME | Polysiloxane solution (ii) | Dicyclohexylamine |
| | 50/30/20 (% by weight) | 90% by weight | 10% by weight | 3% by weight |
| Example 4 | PGMEA/PGME/EAA/PTB | "QUARTRON" PL-2L-PGME | Polysiloxane solution (iii) | Dicyclohexylamine |
| | 48/30/20/2 (% by weight) | 90% by weight | 10% by weight | 3% by weight |
| Example 5 | PGMEA/PGME/EAA/DAA | "QUARTRON" PL-2L-PGME | Polysiloxane solution (iv) | Dicyclohexylamine |
| | 48/30/20/2 (% by weight) | 90% by weight | 10% by weight | 3% by weight |
| Example 6 | PGMEA/PGME/EAA | "QUARTRON" PL-2L-PGME | Polysiloxane solution (i) | Dicyclohexylamine |
| | 50/30/20 (% by weight) | 70% by weight | 30% by weight | 3% by weight |
| Example 7 | PGMEA/PGME/EAA | "QUARTRON" PL-2L-PGME | Polysiloxane solution (i) | Dicyclohexylamine |
| | 50/30/20 (% by weight) | 50% by weight | 50% by weight | 3% by weight |

TABLE 1-continued

| No. | (a) | (b) | (c) | (d) |
|---|---|---|---|---|
| Example 8 | PGMEA/PGME/EAA/IPA | "QUARTRON" PL-2L-IPA | Polysiloxane solution (i) | Dicyclohexylamine |
| | 45/30/20/5 (% by weight) | 90% by weight | 10% by weight | 3% by weight |
| Example 9 | PGMEA/PGME/EAA | "SNOWTEX" PGM-ST | Polysiloxane solution (i) | Dicyclohexylamine |
| | 50/30/20 (% by weight) | 90% by weight | 10% by weight | 3% by weight |
| Example 10 | PGMEA/PGME/EAA | "ADMANANO" YA010C-SV1 | Polysiloxane solution (i) | Dicyclohexylamine |
| | 50/30/20 (% by weight) | 90% by weight | 10% by weight | 3% by weight |
| Example 11 | PGMEA/PGME/AcAc | "QUARTRON" PL-2L-PGME | Polysiloxane solution (i) | Dicyclohexylamine |
| | 40/40/20 (% by weight) | 90% by weight | 10% by weight | 3% by weight |
| Example 12 | PGMEA/PGME/DMM | "QUARTRON" PL-2L-PGME | Polysiloxane solution (i) | Dicyclohexylamine |
| | 50/30/20 (% by weight) | 90% by weight | 10% by weight | 3% by weight |
| Example 13 | PGMEA/PGME/MAA | "QUARTRON" PL-2L-PGME | Polysiloxane solution (i) | Dicyclohexylamine |
| | 50/30/20 (% by weight) | 90% by weight | 10% by weight | 3% by weight |
| Example 14 | PGMEA/PGME/PAA | "QUARTRON" PL-2L-PGME | Polysiloxane solution (i) | Dicyclohexylamine |
| | 50/30/20 (% by weight) | 90% by weight | 10% by weight | 3% by weight |
| Example 15 | PGMEA/PGME/DEM | "QUARTRON" PL-2L-PGME | Polysiloxane solution (i) | Dicyclohexylamine |
| | 50/30/20 (% by weight) | 90% by weight | 10% by weight | 3% by weight |
| Example 16 | PGMEA/PGME/n-BAA | "QUARTRON" PL-2L-PGME | Polysiloxane solution (i) | Dicyclohexylamine |
| | 50/30/20 (% by weight) | 90% by weight | 10% by weight | 3% by weight |
| Example 17 | PGMEA/PGME/EAA | "QUARTRON" PL-2L-PGME | Polysiloxane solution (i) | Dicyclohexylamine |
| | 2/48/50 (% by weight) | 90% by weight | 10% by weight | 3% by weight |

TABLE 2

| No. | (a) | (b) | (c) | (d) |
|---|---|---|---|---|
| Example 18 | PGMEA/PGME/EAA | "SNOWTEX" PGM-ST | Polysiloxane solution (i) | Dicyclohexylamine |
| | 50/30/20 (% by weight) | 90% by weight | 10% by weight | 5% by weight |
| Example 19 | PGMEA/PGME/EAA | "SNOWTEX" PGM-ST | Polysiloxane solution (i) | Dicyclohexylamine |
| | 50/30/20 (% by weight) | 90% by weight | 10% by weight | 10% by weight |
| Example 20 | PGMEA/PGME/EAA | "SNOWTEX" PGM-ST | Polysiloxane solution (i) | Triethylamine |
| | 50/30/20 (% by weight) | 90% by weight | 10% by weight | 3% by weight |
| Example 21 | PGMEA/PGME/EAA | "SNOWTEX" PGM-ST | Polysiloxane solution (i) | Tributylamine |
| | 50/30/20 (% by weight) | 90% by weight | 10% by weight | 3% by weight |
| Example 22 | PGMEA/PGME/EAA | "SNOWTEX" PGM-ST | Polysiloxane solution (i) | Trioctylamine |
| | 50/30/20 (% by weight) | 90% by weight | 10% by weight | 3% by weight |
| Example 23 | PGMEA/PGME/EAA | "SNOWTEX" PGM-ST | Polysiloxane solution (i) | Diethylamine |
| | 50/30/20 (% by weight) | 90% by weight | 10% by weight | 3% by weight |
| Example 24 | PGMEA/PGME/EAA | "SNOWTEX" PGM-ST | Polysiloxane solution (i) | Dibutylamine |
| | 50/30/20 (% by weight) | 90% by weight | 10% by weight | 3% by weight |
| Example 25 | PGMEA/PGME/EAA | "SNOWTEX" PGM-ST | Polysiloxane solution (i) | Dioctylamine |
| | 50/30/20 (% by weight) | 90% by weight | 10% by weight | 3% by weight |
| Example 26 | PGMEA/PGME/EAA | "SNOWTEX" PGM-ST | Polysiloxane solution (i) | 2,2,6,6-Tetramethylpiperidine |
| | 50/30/20 (% by weight) | 90% by weight | 10% by weight | 3% by weight |
| Example 27 | PGMEA/PGME/EAA | "SNOWTEX" PGM-ST | Polysiloxane solution (i) | 1-Ethylpiperidine |
| | 50/30/20 (% by weight) | 90% by weight | 10% by weight | 3% by weight |

TABLE 3

| No. | (a) | (b) | (c) | (d) |
|---|---|---|---|---|
| Comparative Example 1 | IPA/Ethanol/Ethylene glycol monobutyl ether 39/8.5/52.5 (% by weight) | "SNOWTEX" IPA-ST 87% by weight | Ethyl Silicate 48 13% by weight | |
| Comparative Example 2 | PGMEA/PGME 50/50 (% by weight) | "QUARTRON" PL-2L-PGME 90% by weight | Polysiloxane solution (i) 10% by weight | |
| Comparative Example 3 | PGMEA/PGME/EAA 50/30/20 (% by weight) | "QUARTRON" PL-2L-PGME 100% by weight | None | |
| Comparative Example 4 | PGMEA/PGME/EAA 50/30/20 (% by weight) | None | Polysiloxane solution (i) 100% by weight | |
| Comparative Example 5 | IPA/Ethanol/Ethylene glycol monobutyl ether 39/8.5/52.5 (% by weight) | "SNOWTEX" IPA-ST 90% by weight | Ethyl Silicate 48 10% by weight | Dicyclohexylamine 3% by weight |
| Comparative Example 6 | PGMEA/PGME/EAA 50/30/20 (% by weight) | "QUARTRON" PL-2L-PGME 90% by weight | Polysiloxane solution (i) 10% by weight | |

TABLE 4

| No. | n value (@550 nm) | Film thickness on lens $d_{TOP}$ [nm] | $d_{45}$ [nm] | $(d_{45} - d_{TOP})/d_{TOP}$ | Film thickness $d_{BOTTOM}/d_{TOP}$ | uniformity determination | Base followability | Coatability | Ra [nm] | Storage stability |
|---|---|---|---|---|---|---|---|---|---|---|
| Example 1 | 1.30 | 140 | 140 | 0.00 | 2.5 | A | ○ | ○ | 1.75 | ○ |
| Example 2 | 1.31 | 122 | 127 | 0.04 | 2.7 | A | ○ | ○ | 1.63 | ○ |
| Example 3 | 1.33 | 136 | 136 | 0.00 | 2.4 | A | ○ | ○ | 1.54 | ○ |
| Example 4 | 1.34 | 128 | 132 | 0.03 | 2.5 | A | ○ | ○ | 1.63 | ○ |
| Example 5 | 1.38 | 120 | 125 | 0.04 | 2.8 | A | ○ | ○ | 1.63 | ○ |
| Example 6 | 1.36 | 138 | 141 | 0.02 | 2.6 | A | ○ | ○ | 2.10 | ○ |
| Example 7 | 1.39 | 128 | 135 | 0.05 | 2.8 | A | ○ | ○ | 8.92 | ○ |
| Example 8 | 1.31 | 140 | 145 | 0.04 | 2.6 | A | ○ | ○ | 1.95 | ○ |
| Example 9 | 1.30 | 135 | 135 | 0.00 | 2.4 | A | ○ | ○ | 1.72 | ○ |
| Example 10 | 1.37 | 60 | 60 | 0.00 | 2.7 | A | ○ | ○ | 1.50 | ○ |
| Example 11 | 1.32 | 135 | 139 | 0.03 | 2.3 | A | ○ | ○ | 1.60 | ○ |
| Example 12 | 1.31 | 133 | 133 | 0.00 | 2.4 | A | ○ | ○ | 1.53 | ○ |
| Example 13 | 1.32 | 140 | 140 | 0.00 | 2.3 | A | ○ | ○ | 1.95 | ○ |
| Example 14 | 1.32 | 125 | 125 | 0.00 | 2.3 | A | ○ | ○ | 1.72 | ○ |
| Example 15 | 1.32 | 125 | 128 | 0.02 | 2.7 | A | ○ | ○ | 1.50 | ○ |
| Example 16 | 1.33 | 108 | 112 | 0.04 | 2.7 | A | ○ | ○ | 1.53 | ○ |
| Example 17 | 1.32 | 130 | 131 | 0.01 | 2.6 | A | ○ | ○ | 1.41 | ○ |

TABLE 5

| No. | n value (@550 nm) | Film thickness on lens $d_{TOP}$ [nm] | $d_{45}$ [nm] | $(d_{45} - d_{TOP})/d_{TOP}$ | Film thickness $d_{BOTTOM}/d_{TOP}$ | uniformity determination | Base followability | Coatability | Ra [nm] | Storage stability |
|---|---|---|---|---|---|---|---|---|---|---|
| Example 18 | 1.34 | 121 | 121 | 0.00 | 2.2 | A | ○ | ○ | 1.50 | ○ |
| Example 19 | 1.33 | 116 | 116 | 0.00 | 2.0 | A | ○ | ○ | 1.53 | ○ |
| Example 20 | 1.31 | 125 | 126 | 0.01 | 2.4 | A | ○ | ○ | 3.00 | ○ |
| Example 21 | 1.34 | 117 | 117 | 0.00 | 2.1 | A | ○ | ○ | 1.63 | ○ |
| Example 22 | 1.34 | 114 | 114 | 0.00 | 2.8 | A | ○ | ○ | 1.54 | ○ |
| Example 23 | 1.32 | 128 | 129 | 0.01 | 2.3 | A | ○ | ○ | 1.63 | ○ |
| Example 24 | 1.33 | 111 | 111 | 0.00 | 2.2 | A | ○ | ○ | 3.00 | ○ |
| Example 25 | 1.33 | 127 | 128 | 0.01 | 2.7 | A | ○ | ○ | 1.95 | ○ |
| Example 26 | 1.32 | 119 | 119 | 0.00 | 2.4 | A | ○ | ○ | 1.72 | ○ |
| Example 27 | 1.34 | 124 | 125 | 0.01 | 2.5 | A | ○ | ○ | 1.60 | ○ |

TABLE 6

| No. | n value (@550 nm) | Film thickness on lens | | | | Film thickness uniformity determination | Base followability | Coatability | Ra [nm] | Storage stability |
| --- | --- | --- | --- | --- | --- | --- | --- | --- | --- | --- |
| | | $d_{TOP}$ [nm] | $d_{45}$ [nm] | $(d_{45} - d_{TOP})/d_{TOP}$ | $d_{BOTTOM}/d_{TOP}$ | | | | | |
| Comparative Example 1 | 1.31 | 29 | 140 | 3.03 | 10.3 | C | X | X<br>Brush marks<br>Many foreign matters | 2.31 | X<br>Particle precipitation two days later |
| Comparative Example 2 | 1.31 | 56 | 145 | 1.59 | 7.5 | C | X | X<br>Brush marks<br>Many foreign matters | 1.56 | X<br>Particle precipitation two days later |
| Comparative Example 3 | Un-measurable | — | — | — | — | — | — | X<br>Foreign matters, cissing, and unevenness on whole surface after coating | — | ○ |
| Comparative Example 4 | 1.43 | 30 | 145 | 3.83 | 10.7 | C | X | ○ | 1.53 | ○ |
| Comparative Example 5 | 1.31 | 117 | 139 | 0.19 | 3.4 | B | X | X<br>Brush marks<br>Many foreign matters | 2.20 | X<br>Particle precipitation one day later |
| Comparative Example 6 | 1.30 | 140 | 140 | 0.00 | 3.1 | A | X | ○ | 1.75 | ○ |

The invention claimed is:

1. A resin composition comprising a solvent (a), silica particles (b), a polysiloxane (c) and a secondary or tertiary amine compound (d), wherein:
the solvent (a) contains an organic acid; and
the polysiloxane (c) is a polysiloxane obtained by hydrolyzing and/or polycondensing at least one alkoxysilane compound which includes at least one compound represented by general formula (8):

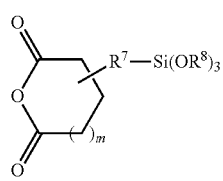

(8)

wherein m represents an integer of 0 to 2, $R^7$ represents an alkylene group having 1 to 4 carbon atoms, and each of $R^8$s independently represents hydrogen or an alkyl group having 1 to 4 carbon atoms.

2. The resin composition according to claim 1, wherein the organic acid contained in the solvent (a) is an organic acid having a pH of 4.0 to 6.8 when diluted 5-fold in terms of mass ratio with a 50% by mass aqueous ethanol solution.

3. The resin composition according to claim 1, wherein the organic acid includes a solvent having a β-diketone structure represented by general formula (1):

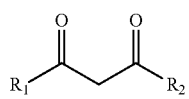

(1)

wherein, in general formula (1), $R^1$ and $R^2$ each may be the same or different, and represent —$CH_3$, —$C_2H_5$, —$C_3H_7$, —$C_4H_9$, —$OCH_3$, —$OC_2H_5$, —$OC_3H_7$, or —$OC_4H_9$.

4. The resin composition according to claim 1, wherein a proportion of the solvent having a β-diketone structure represented by general formula (1) in the solvent (a) is 10% by weight or more and less than 70% by weight.

5. The resin composition according to claim 1, wherein the solvent having a β-diketone structure represented by general formula (1) has a boiling point of 50° C. or more and 200° C. or less.

6. The resin composition according to claim 1, wherein the silica particles (b) each have a particle size of 1 to 100 nm.

7. The resin composition according to claim 1, wherein the secondary or tertiary amine compound (d) is a compound represented by general formula (9):

(9)

wherein $R^9$ and $R^{10}$ each may be the same or different, and represent an aliphatic hydrocarbon group having 2 to 12 carbon atoms, and $R^{11}$ is an aliphatic hydrocarbon group having 2 to 12 carbon atoms or a hydrogen atom.

8. The resin composition according to claim 1, wherein a content of the secondary or tertiary amine compound (d) is 1 to 10% by weight based on a total amount of the silica particles (b) and the polysiloxane (c).

9. The resin composition according to claim 1, wherein the at least one alkoxysilane compound additionally includes a compound represented by general formula (7):

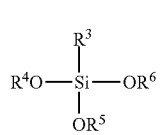

(7)

wherein $R^3$ is a fluorinated alkyl group having 1 to 5 carbon atoms, and $R^4$, $R^5$ and $R^6$ each independently represent hydrogen or an alkyl group having 1 to 4 carbon atoms.

10. A solid imaging element comprising a photoelectric conversion portion, a lens provided above a light-receiving surface of the photoelectric conversion portion, and an anti-reflection film provided on the lens, wherein the anti-reflection film includes a cured film of a resin composition comprising a solvent (a), silica particles (b), a polysiloxane (c) and a secondary or tertiary amine compound (d), wherein the solvent (a) contains an organic acid.

11. The solid imaging element according to claim 10, wherein when a thickness of the cured film in the lens top is defined as drop, when thicknesses of the cured film are defined as $d_{45L}$ and $d_{45R}$ at points where in the arbitrary cross section that passes through the lens top and that is orthogonal to the lens bottom surface, a line drawn perpendicularly to the lens bottom surface from the lens top intersects with the lens bottom surface and a line extending at 45° in a left direction and a line extending at 45° in a right direction from the intersecting point of the lens bottom surface intersect with the lens, and an average value of $d_{45L}$ and $d_{45R}$ is defined as $d_{45}$, the $d_{TOP}$ and the $d_{45}$ satisfy $0 \leq (d_{45} - d_{TOP})/d_{TOP}) \leq 0.20$.

12. The solid imaging element according to claim 10, wherein the cured film has a film thickness in a range of 50 to 200 nm.

13. The solid imaging element according to claim 10, wherein the cured film has a refractive index of 1.2 or more and 1.4 or less at a wavelength of 550 nm.

14. The solid imaging element according to claim 10, wherein a difference in refractive index between the lens and the cured film is 0.2 to 0.8 at a wavelength of 550 nm.

15. A process for producing the solid imaging element according to claim 10, the process comprising a step of applying the resin composition onto the lens, and a step of heating the resin composition.

16. The process for producing the solid imaging element according to claim 15, wherein the applying step is a step of applying the resin composition onto the lens by a spin coating method.

* * * * *

UNITED STATES PATENT AND TRADEMARK OFFICE
CERTIFICATE OF CORRECTION

PATENT NO. : 10,316,146 B2
APPLICATION NO. : 15/546873
DATED : June 11, 2019
INVENTOR(S) : Toshiyasu Hibino et al.

Page 1 of 1

It is certified that error appears in the above-identified patent and that said Letters Patent is hereby corrected as shown below:

On the Title Page

ITEM [72], Inventors:
"Toshiyasu Hibino, Otsu (JP)" should read --Toshiyasu Hibino, Otsu-shi, Shiga (JP)--.
"Manami Fujii, Otsu (JP)" should read --Manami Fujii, Otsu-shi, Shiga (JP)--.
"Mitsuhito Suwa, Otsu (JP)" should read --Mitsuhito Suwa, Otsu-shi, Shiga (JP)--.

In the Claims

At Column 25, Line 15, in Claim 11, "defined as drop," should read --defined as $d_{TOP}$,--.

Signed and Sealed this
Thirtieth Day of July, 2019

Andrei Iancu
*Director of the United States Patent and Trademark Office*